United States Patent
Findeklkee et al.

(10) Patent No.: US 11,221,385 B2
(45) Date of Patent: Jan. 11, 2022

(54) IMPEDANCE MATCHING USING MULTIPLE PORTS

(71) Applicant: KONINKLIJKE PHILIPS N.V., Eindhoven (NL)

(72) Inventors: Christian Findeklkee, Norderstedt (DE); Christoph Leussler, Hamburg (DE); Falk Uhlemann, Hamburg (DE); Peter Vernickel, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 281 days.

(21) Appl. No.: 16/339,067

(22) PCT Filed: Oct. 2, 2017

(86) PCT No.: PCT/EP2017/074925
§ 371 (c)(1),
(2) Date: Apr. 3, 2019

(87) PCT Pub. No.: WO2018/065338
PCT Pub. Date: Apr. 12, 2018

(65) Prior Publication Data
US 2020/0041587 A1 Feb. 6, 2020

(30) Foreign Application Priority Data
Oct. 6, 2016 (EP) .................................. 16192544

(51) Int. Cl.
*G01R 33/36* (2006.01)
(52) U.S. Cl.
CPC ..... *G01R 33/3628* (2013.01); *G01R 33/3664* (2013.01)
(58) Field of Classification Search
CPC ............ G01R 33/3628; G01R 33/3664; G01R 33/365; G01R 33/34076; G01R 33/3453
See application file for complete search history.

(56) References Cited

U.S. PATENT DOCUMENTS

| 5,483,158 A | 1/1996 | Van Heteren et al. |
| 2011/0175616 A1* | 7/2011 | Ochi ................ G01R 33/34076 324/318 |

(Continued)

OTHER PUBLICATIONS

Christinan Findeklee et al "Highly Efficient Inductively Coupled Double Resonant Surface Coil for Simultaneous 1H/19F PET-MRI", ISMRM 2013, p. 828.

*Primary Examiner* — Rishi R Patel

(57) ABSTRACT

The invention provides for a magnetic resonance imaging system (100) comprising a main magnet (104) for generating a main magnetic field within an imaging zone (108). The magnetic resonance imaging system further comprises an RF coil (114) for acquiring magnetic resonance data (164) from the imaging zone, wherein the RF coil comprises multiple RF ports (124, 412, 414, 416, 500, 502, 702, 1004, 1006). The RF coil comprises a switch unit (120) for at least one of the multiple RF ports to individually couple or uncouple the at least one of of the multiple RF ports from the RF coil. The magnetic resonance imaging system further comprises a radio-frequency system (125) for supplying radio-frequency power to each of the multiple RF ports and an RF matching detection system (122) for measuring impedance matching data (166) between the radio-frequency system and the RF coil. Execution of the machine executable instructions causes a processor controlling the magnetic resonance imaging system to measure (200, 300, 302, 304) the impedance matching data using the RF matching detection system; determine (202) switch unit control instructions (168) using the impedance matching data, wherein the switch control instructions contain commands that control the at least one of the multiple RF ports to couple or decouple to impedance match the radio-frequency system to the RF coil; and control (204) the switch unit of the at (Continued)

least one of the multiple RF ports with the switch unit control instructions.

20 Claims, 8 Drawing Sheets

(56) References Cited

U.S. PATENT DOCUMENTS

| | | |
|---|---|---|
| 2012/0169335 A1 | 7/2012 | Leussler et al. |
| 2012/0262173 A1* | 10/2012 | Soutome ............ G01R 33/3453 324/309 |
| 2014/0055136 A1 | 2/2014 | Leussler et al. |
| 2014/0139218 A1 | 5/2014 | Findeklee et al. |
| 2015/0002156 A1 | 1/2015 | Leussler et al. |
| 2017/0089989 A1 | 3/2017 | Findeklee et al. |

* cited by examiner

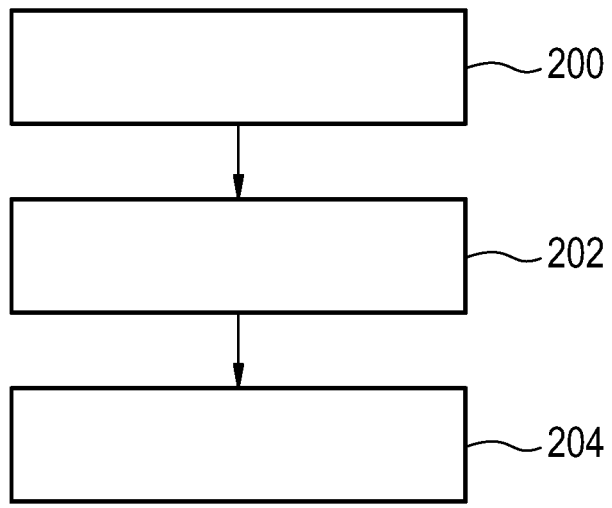
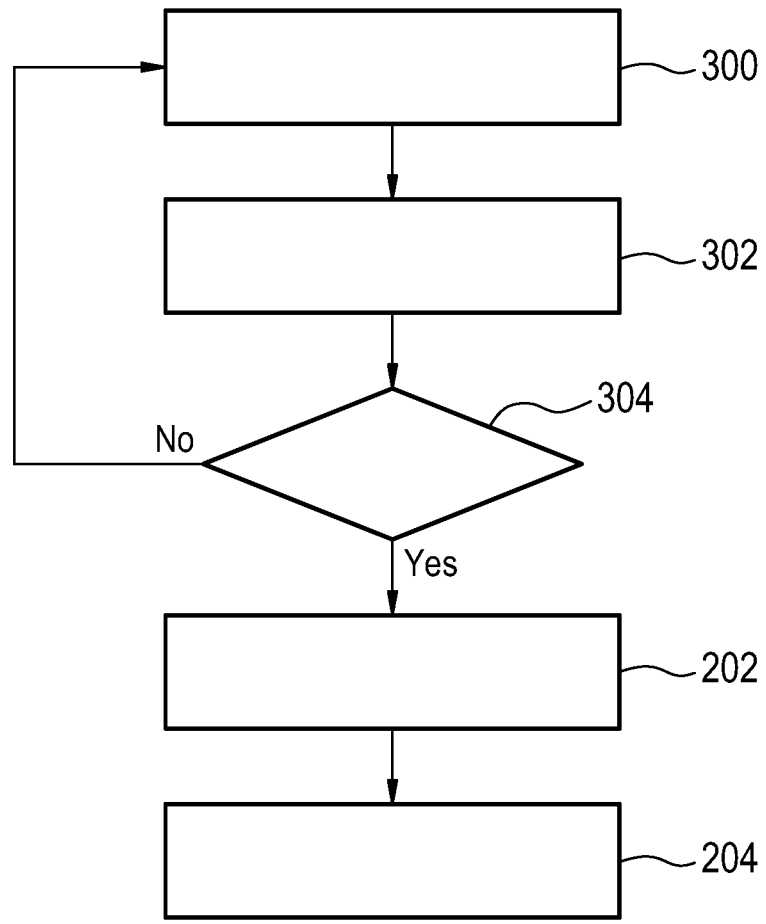

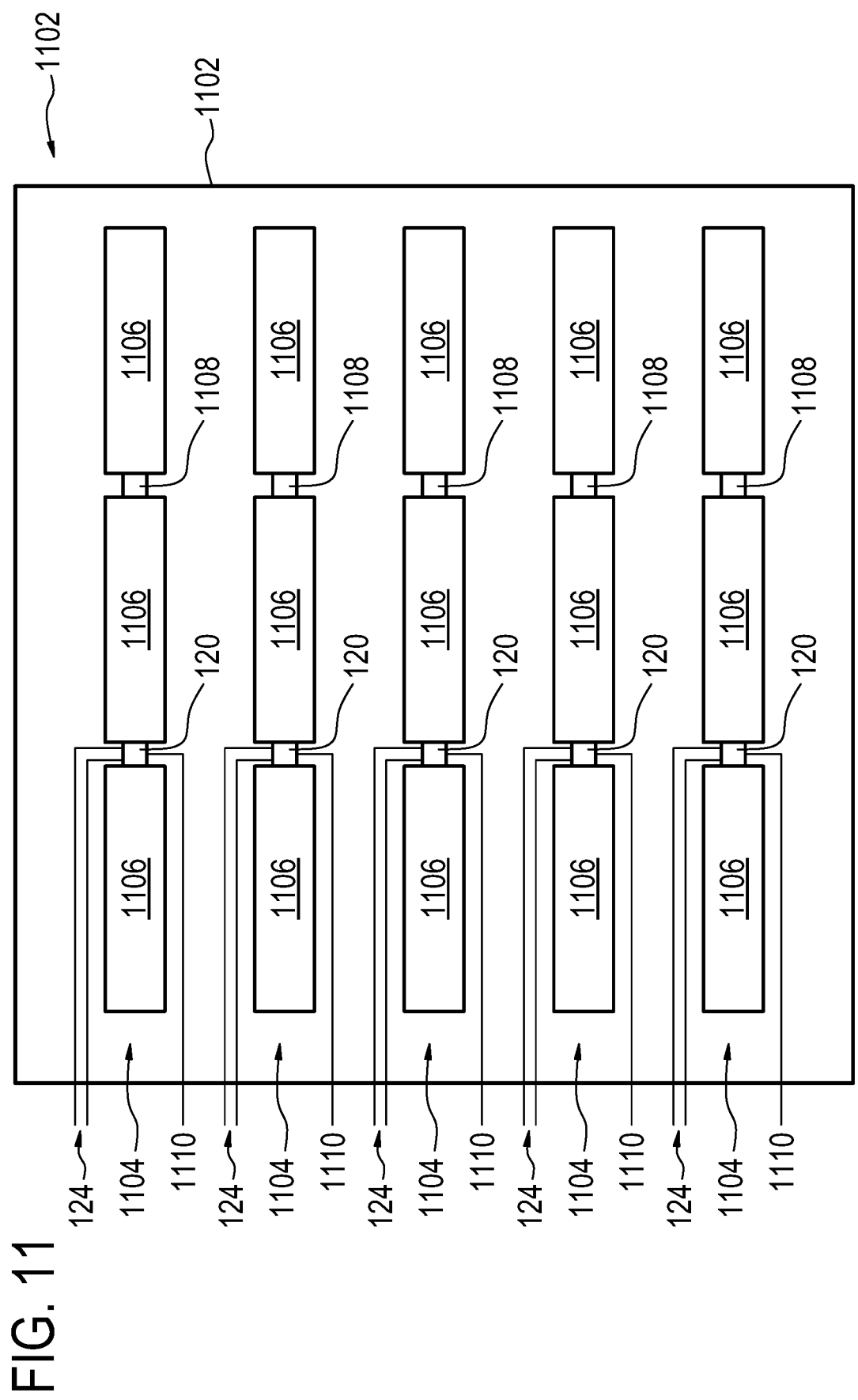

IMPEDANCE MATCHING USING MULTIPLE PORTS

CROSS REFERENCE TO RELATED APPLICATIONS

This application is a U.S. national phase application of International Application No. PCT/EP2017/074925 filed on Oct. 2, 2017, which claims the benefit of EP Application Serial No. 16192544.1 filed on Oct. 6, 2016 and is incorporated herein by reference.

FIELD OF THE INVENTION

The invention relates to magnetic resonance imaging, in particular to the impedance matching of radio-frequency antennas used for magnetic resonance imaging.

BACKGROUND OF THE INVENTION

A large static magnetic field is used by Magnetic Resonance Imaging (MRI) scanners to align the nuclear spins of atoms as part of the procedure for producing images within the body of a patient. This large static magnetic field is referred to as the B0 field or the main magnetic field.

One method of spatially encoding is to use magnetic field gradient coils. Typically there are three coils which are used to generate three different gradient magnetic fields in three different orthogonal directions.

During an MRI scan, Radio Frequency (RF) pulses generated by one or more transmitter coils generate a magnetic field called the B1 field.

United States patent application US 2014/0055136 discloses an RF volume resonator system is disclosed comprising a multi-port RF volume resonator, like e.g. a TEM volume coil or TEM resonator, or a birdcage coil, all of those especially in the form of a local coil like a head coil, or a whole body coil, and a plurality of transmit and/or receive channels for operating the multi-port RF volume resonator for transmitting RF excitation signals and/or for receiving MR relaxation signals into/from an examination object or a part thereof. By the individual selection of each port and the appropriate amplitude and/or frequency and/or phase and/or pulse shapes of the RF transmit signals according to the physical properties of an examination object, a resonant RF mode within the examination object with an improved homogeneity can be excited by the RF resonator.

SUMMARY OF THE INVENTION

The invention provides for a magnetic resonance imaging system, a computer program product, and a method in the independent claims. Embodiments are given in the dependent claims.

Magnetic resonance imaging (MRI) systems comprise several different components. A main magnet generates a magnetic field which serves to align magnetic spins within an imaging zone. Spins within the imaging zone are then manipulated using magnetic field gradient coils and at least one radio-frequency (RF) coil. The RF coil is connected to an RF transmitter and/or receiver (generically referred to as a transceiver herein) and may also require a matching network to impedance match the RF coil to the transceiver. The transceiver and the matching network can be expensive components and may add to the cost of constructing a magnetic resonance imaging system.

Examples of the invention may provide for a means of reducing the cost of components needed for effectively matching the RF coil to the transceiver. Instead of using a single transceiver and a single impedance matching network, the RF coil is supplied RF power at a number of RF ports. The number of ports to which RF power is supplied is able to be controlled. By controlling the number of RF ports to which RF power is supplied the matching of the RF coil is achieved.

Adding additional RF ports can be used to change the relationship between RF voltage and RF current supplied to an RF coil. For example if two corresponding ports (i.e. 180 degrees apart on one of the rings) on a bird cage RF coil are supplied with RF power, the same RF voltage can be applied to both ports. Because these ports are equivalent, each port need only supply one half of the current that would need to be supplied to a single port. Changing the number of RF ports therefore changes the current-voltage relationship that an individual RF supply (RF transmitter or transceiver) sees as it is connected to the RF coil. A multiplicity of RFs supplies which can be controllably connected or disconnected to the RF coil can therefore effectively impedance match an RF coil without (or with a reduced) impedance matching network. This may have several advantages, firstly expensive components in the matching network such as a circulator may be able to be avoided. An additional advantage may be that lower power, and less expensive, RF supplies may be used. Also, RF supplies that are not currently connected to the RF coils may be switched off or put into a state where the power consumption is reduced. Embodiments may therefore not only reduce the manufacturing cost but may also reduce the amount of power required to perform a magnetic resonance imaging scan.

In one aspect the invention provides for a magnetic resonance imaging system comprising a main magnet for generating a main magnetic field within an imaging zone. The main magnetic field is used to align spins of atoms within the imaging zone. The main magnetic field is often referred to as the so called B0 field. The magnetic resonance imaging system further comprises an RF coil for acquiring magnetic resonance data from the imaging zone. The acquisition of the magnetic resonance data by the RF coil may include transmission and/or reception of radio-frequency signals. The RF coil may be used for transmission, reception or both transmission and reception. The RF coil comprises multiple RF ports. An RF port is a place where RF power or radio-frequency energy is fed into the RF coil. For example the RF port may be connected to a transmitter, a receiver, or transceiver. The RF coil comprises a switch unit for at least one of the multiple RF ports to individually couple or uncouple the at least one of the multiple RF ports from the RF coil. The magnetic resonance imaging system further comprises a radio-frequency system for supplying radio-frequency power to each of the multiple RF ports. In some examples the radio-frequency system may comprise a power supply for each of the multiple RF ports. In other examples a radio-frequency power supply is able to independently supply power to each of the multiple RF ports.

The magnetic resonance imaging system further comprises an RF matching detection system for measuring impedance matching data between the radio-frequency system and the radio-frequency coil. The measurement of the impedance matching data may be direct or indirect. An example of a direct method would be to measure the actual impedance of the RF coil. An indirect method would be for example to put a test signal into various combinations or permutations of the multiple RF ports and measure a matching condition such as reflected power.

The magnetic resonance imaging system further comprises a memory for storing machine-executable instructions. The magnetic resonance imaging system further comprises a processor for controlling the magnetic resonance imaging system. As used herein a processor and a memory may refer to one or more memories or processors.

Execution of the machine-executable instructions further causes the processor to measure the impedance matching data using the RF matching detection system. Execution of the machine-executable instructions further causes the processor to determine switch unit control instructions using the impedance matching data. The switch control instructions contain commands that control the at least one of the multiple RF ports to couple or decouple to impedance match the radio-frequency system to the RF coil. Execution of the machine-executable instructions further causes the processor to control the switch unit of the at least one of the multiple RF ports with the switch unit control instructions. This for example may be done during the execution of a pulse sequence to acquire the magnetic resonance data. For example a pulse sequence may contain data or instructions which are used to control the magnetic resonance imaging system to acquire the magnetic resonance data. The pulse sequence may for instance specify a power to be supplied by the RF coil for measuring the magnetic resonance data. The above described instructions could then be performed to control the switch unit such that for a particular power and subject within the magnetic resonance imaging system the RF coil is efficiently matched to the radio-frequency system.

This embodiment may have the advantage of providing for a magnetic resonance imaging system that costs less to manufacture. By matching the radio-frequency system to the RF coil by controlling the multiple RF ports may reduce the need for expensive components in the matching network or RF system such as circulators. It may also reduce the need for matching network or circuits.

In some examples, the switching units can be solid state units such as pin diodes or even FET transistors.

In another embodiment, the radio-frequency coil may comprise a carrier structure. The switching unit may be mounted on the carrier structure. Mounting the switching unit on the carrier structure may be beneficial because it may serve to provide for improved switching of the RF power.

In another embodiment, the measurement of the impedance matching data comprises repeatedly acquiring the impedance matching data while permutating states of the switch unit for at least one of the multiple RF ports. This embodiment may be beneficial because it may be measured efficiently and inexpensively. For example inexpensive SWR meters may be used to measure reflected power. By minimizing the amount of reflected power the proper combination of radio-frequency ports can be switched on or off.

In another embodiment, the RF matching detection system comprises a reflected power sensor such as an SWR meter. The impedance matching data comprises reflected power data for the at least one of the multiple RF ports. This example may be beneficial because the matching of the radio-frequency system to the RF coil can be achieved using inexpensive means.

In another embodiment, the RF matching detection system comprises a B1 magnetic field measurement system for measuring B1 magnetic field data descriptive of the B1 magnetic field generated by the RF coil. The impedance matching data comprises the B1 magnetic field measurement data. This embodiment may be beneficial because the degree of matching between the radio-frequency system and the RF coil.

In another embodiment, the B1 magnetic field measurement system comprises at least one magnetic field sensor. For example within the bore of the magnet or even on a support for a subject, B1 magnetic field sensors can be placed within the magnetic resonance imaging system. This may be useful in measuring directly and in multiple sensors that are used the homogeneity of the B1 magnetic field.

In another embodiment, the B1 magnetic field measurement system comprises the RF coil and the radio-frequency system. Execution of the machine-executable instructions causes the processor to acquire the B1 magnetic field data at least partially by controlling the magnetic resonance imaging system with B1 mapping pulse sequence commands to acquire B1 mapping magnetic resonance data. The B1 mapping pulse sequence commands cause the magnetic resonance imaging system to acquire the B1 mapping magnetic resonance data according to a B1 mapping magnetic resonance imaging protocol. Execution of the machine executable instructions further cause the processor to acquire the B1 magnetic field data at least partially by reconstructing a B1 field map from the B1 mapping magnetic resonance data according to a B1 mapping magnetic resonance imaging protocol.

Execution of the machine-executable instructions further causes the processor to acquire the B1 magnetic field data at least partially by reconstructing a B1 field map from the B1 mapping magnetic resonance data according to the B1 mapping magnetic resonance imaging protocol. The impedance matching data comprises the B1 field map. Various types of magnetic resonance imaging protocols may be used. In principle any magnetic resonance imaging protocol that measures data which may be used for measuring the B1 magnetic field may be used. Several examples, which do not limit, are so called Dixon methods, and also various types of magnetic resonance imaging protocols where there is phase encoding.

The measurement of the B1 magnetic field using pulse sequences may be beneficial because it may provide for an inexpensive means of updating a magnetic resonance imaging system without adding sensors.

In another embodiment the at least one of the multiple RF ports comprises inductive feeding loops. An inductive feeding loop as used herein comprises a loop antenna or element which couples inductively to the RF coil. Each of the multiple inductive feeding loops is configured for coupling inductively to the birdcage coil.

In another embodiment the switch unit of each of the multiple inductive feeding loops is configured for any one of the following: creating an open circuit in each of the multiple inductive feeding loops or deactivating each of the multiple inductive feeding loops. Deactivating each of the multiple inductive feeding loops may for instance in some examples be considered detuning such that it does no longer efficiently couple to the radio-frequency coil.

In another embodiment the RF matching detection system comprises the radio-frequency system and at least two of the multiple inductive feeding loops. The impedance matching data comprises load factor data. The load factor data is descriptive of a load factor or a Q value of the radio-frequency coil. Measurement of the impedance matching data using the RF matching detection system comprises providing a known radio-frequency signal to at least one of the at least two of the multiple inductive feeding loops using the radio-frequency system. Measurement of the impedance matching data using the RF matching detection system further comprises measuring a measured RF signal from at least one of the at least two of the multiple inductive feeding loops using the radio-frequency system. Measurement of the impedance matching data using the RF matching detection system further comprises calculating the load factor or the Q value using the measured RF signal. Using for example the load factor or the Q value, the number or a particular radio-frequency port to be used can be determined.

In another embodiment the RF coil is a birdcage coil.

In another embodiment the RF coil is a TEM coil. A TEM coil is a transverse electromagnetic coil.

In another embodiment the RF coil is a single dipole antenna.

In another embodiment the RF coil is a birdcage coil. The RF coil comprises two end rings. The birdcage coil comprises multiple rungs connecting the two end rings. In different embodiments the birdcage coil can take different configurations. In one configuration each of the two end rings comprises ring segments. At least a selection of the multiple RF ports is connected across two of the ring segments. The end rings can for example be divided into multiple segments. The segments may for instance be connected by conductors or may be connected using capacitors. In the case where there is an electrical connection between the ring segments, a switching unit may be used to connect the radio-frequency power across two of the ring segments. For instance a pin diode may be used to make or break an electrical connection.

In another example of a birdcage coil, each of the multiple rungs comprises rung segments. At least a selection of the multiple RF ports is connected across two of the rung segments. The description of how the various ring segments can be connected is also applicable to the rung segments.

In a further example of a birdcage coil the birdcage coil comprises a radio-frequency shield. At least one of the multiple RF ports is connected across the RF shield and one of the two end rings. In yet a further example, the at least one of the multiple RF ports is connected between one of the end rings and one of the multiple rungs. Again, as described above, the connection of the birdcage coil and the rungs to the rings may be considered equivalent to connections between ring segments.

In yet a further example, any of the previous examples of the birdcage coil may be combined together.

In another embodiment, the RF coil is a TEM coil comprising multiple strip elements. The strip elements comprise strip segments. At least a selection of the multiple RF ports is connected across two of the strip segments. Connections between the strip segments may be considered to be equivalent to connections between ring segments. The various strip segments may for instance be connected electrically or via a capacitive connection.

In another embodiment, execution of the machine-executable instructions further cause the processor to control the magnetic resonance imaging system to acquire imaging magnetic resonance data using imaging pulse sequence commands. The imaging pulse sequence commands are configured to control the magnetic resonance imaging system to acquire the imaging magnetic resonance data according to a magnetic resonance imaging protocol. During this acquisition the switch units of the at least one of the multiple RF ports may be controlled using the control instructions. For example the pulse sequence commands could specify a particular RF power to supply to the RF coil during the acquisition of the magnetic resonance data. The switch units could then be controlled to properly match the radio-frequency system to the RF coil during the acquisition of the imaging magnetic resonance data. Execution of the machine-executable instructions further causes the processor to reconstruct a magnetic resonance image using the imaging magnetic resonance data. This embodiment may be beneficial because it may provide for a system which is able to acquire imaging magnetic resonance data at a lower cost due the elimination of various radio-frequency components.

In another aspect, the invention provides for a method of operating the magnetic resonance imaging system. The magnetic resonance imaging system comprises a main magnet for generating the main magnetic field within the imaging zone. The magnetic resonance imaging system further comprises an RF coil for acquiring magnetic resonance data from the imaging zone. The RF coil comprises multiple RF ports. The RF coil comprises a switch unit for at least one of the multiple RF ports to individually couple or uncouple the at least one of the multiple RF ports from the RF coil. The magnetic resonance imaging system further comprises a radio-frequency system for supplying radio-frequency power to each of the multiple RF ports. The magnetic resonance imaging system further comprises an RF matching detection system for measuring impedance matching data between the radio-frequency system and the RF coil.

The method comprises measuring the impedance matching data using the RF matching detection system. The method further comprises determining switch unit control instructions using the impedance matching data. The switch unit instructions contain commands that control the at least one of the multiple RF ports to couple or decouple in order to impedance match the radio-frequency system to the RF coil. The method further comprises controlling the switch unit of the at least one of the multiple RF ports with the switch unit control instructions.

In another embodiment, the method further comprises placing an object within the imaging zone before measuring the impedance matching data.

In another embodiment, the radio-frequency coil has a data acquisition zone. The data acquisition zone is located within the imaging zone.

In another aspect, the invention provides for a computer program product comprising machine-executable instructions for execution by a processor controlling the magnetic resonance imaging system. The magnetic resonance imaging system comprises a main magnet for generating a main magnetic field within the imaging zone. The magnetic resonance imaging system further comprises an RF coil for acquiring magnetic resonance data from an imaging zone. The RF coil comprises multiple RF ports. The RF coil comprises a switch unit for at least one of the multiple RF ports to individually couple or uncouple the at least one of the multiple RF ports from the RF coil. The magnetic resonance imaging system further comprises a radio-frequency system for supplying radio-frequency power to each of the multiple RF ports. The magnetic resonance imaging system further comprises an RF matching detection system for measuring impedance matching data between the radio-frequency system and the RF coil.

Execution of the machine-executable instructions further causes the processor to measure the impedance matching data using the RF matching detection system. Execution of the machine-executable instructions further causes the processor to determine switch unit control instructions using the impedance matching data. The switch unit control instructions contain commands that control the at least one of the multiple RF ports to couple or decouple to impedance match the radio-frequency system to the RF coil. Execution of the instructions further cause the processor to control the switch unit of the at least one of the multiple RF ports with the switch unit control instructions. The advantages of this embodiment have been previously discussed.

It is understood that one or more of the aforementioned embodiments of the invention may be combined as long as the combined embodiments are not mutually exclusive.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A "computer-readable storage medium" as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

"Computer memory" or "memory" is an example of a computer-readable storage medium. Computer memory is any memory which is directly accessible to a processor. "Computer storage" or "storage" is a further example of a computer-readable storage medium. Computer storage may be any volatile or non-volatile computer-readable storage medium.

A "processor" as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the C programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further understood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A "user interface" as used herein is an interface which allows a user or operator to interact with a computer or computer system. A "user interface" may also be referred to as a "human interface device." A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A "hardware interface" as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, bluetooth connection, wireless local area network connection, TCP/IP connection, ethernet connection, control voltage interface, MIDI interface, analog input interface, and digital input interface.

A "display" or "display device" as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) display, Electroluminescent display (ELD), Plasma display panel (PDP), Liquid crystal display (LCD), Organic light-emitting diode display (OLED), a projector, and Head-mounted display.

Magnetic Resonance (MR) data is defined herein as being the recorded measurements of radio frequency signals emitted by atomic spins using the antenna of a magnetic resonance apparatus during a magnetic resonance imaging scan. Magnetic resonance data is an example of medical imaging data. A Magnetic Resonance (MR) image is defined herein as being the reconstructed two or three dimensional visualization of anatomic data contained within the magnetic resonance imaging data.

BRIEF DESCRIPTION OF THE DRAWINGS

In the following preferred embodiments of the invention will be described, by way of example only, and with reference to the drawings in which:

FIG. 2 shows a flow chart which illustrates a method of operating the magnetic resonance imaging system of FIG. 1;

FIG. 3 shows a flow chart which illustrates a further method of operating the magnetic resonance imaging system of FIG. 1;

FIG. 11 illustrates and example of a TEM antenna.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
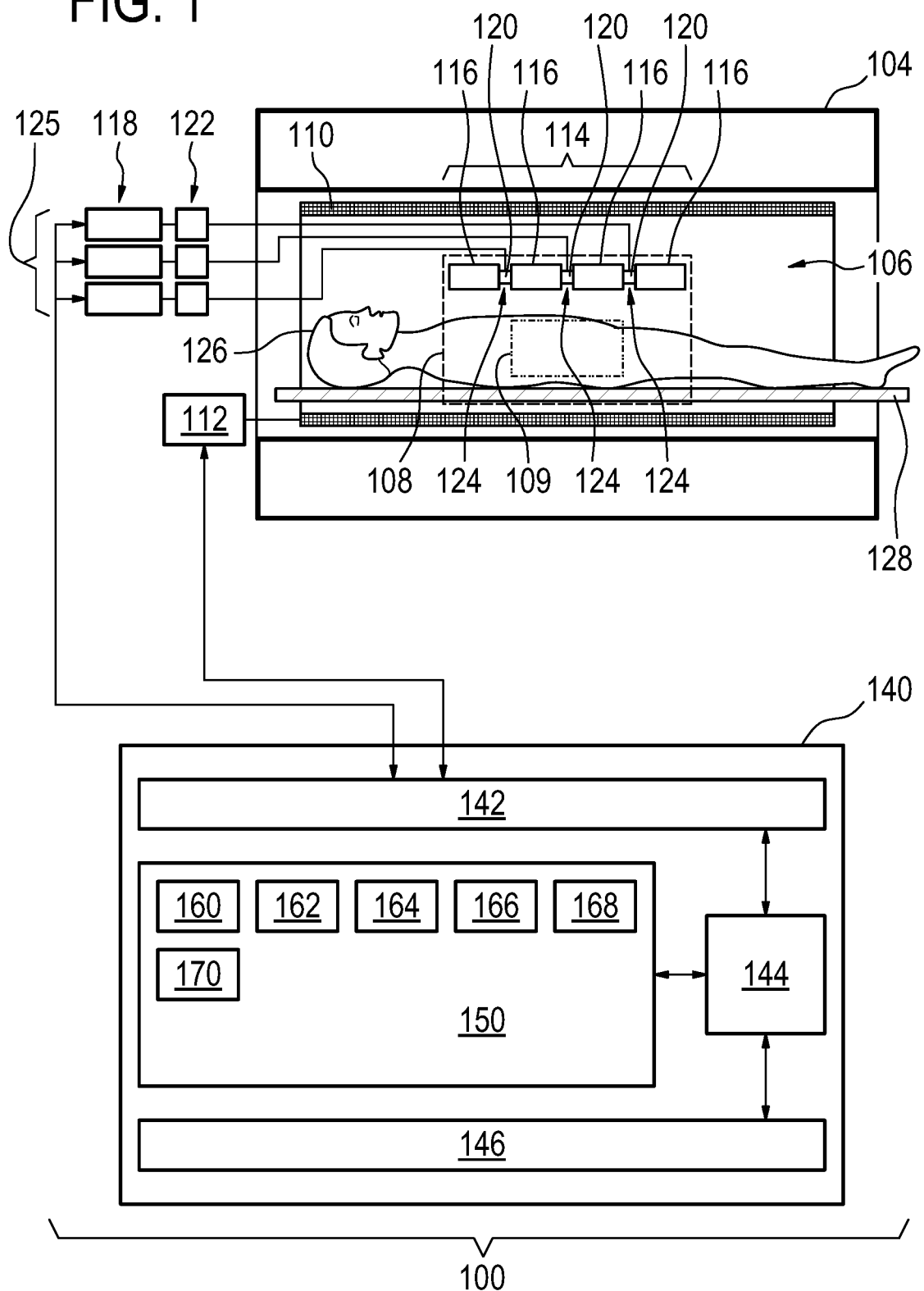
FIG. 1 illustrates an example of a magnetic resonance imaging system.

FIG. 1 illustrates an example of a magnetic resonance imaging system 100. The magnetic resonance imaging system comprises a main magnet 104, which may be referred to as the magnet. The magnet 104 is a superconducting cylindrical type magnet 104 with a bore 106 through it. The use of different types of magnets is also possible. Inside the cryostat of the cylindrical magnet, there is a collection of superconducting coils. Within the bore 106 of the cylindrical magnet 104 there is an imaging zone 108 where the magnetic field is strong and uniform enough to perform magnetic resonance imaging.

Within the bore 106 of the magnet 104 there is also a set of magnetic field gradient coils 110 which is used for acquisition of magnetic resonance data to spatially encode magnetic spins within the imaging zone 108 of the magnet 104. The magnetic field gradient coils 110 are connected to a magnetic field gradient coil power supply 112. The magnetic field gradient coils 110 are intended to be representative. Typically magnetic field gradient coils 110 contain three separate sets of coils for spatially encoding in three orthogonal spatial directions. A magnetic field gradient power supply 112 supplies current to the magnetic field gradient coils 110. The current supplied to the magnetic field gradient coils 110 is controlled as a function of time and may be ramped or pulsed.

Adjacent to the imaging zone 108 is a radio-frequency (RF) coil 114 for manipulating the orientation of magnetic spins within the imaging zone 108 and for receiving radio transmissions from spins also within the imaging zone 108. The radio frequency coil 114 may also be referred to as a radio frequency antenna or antenna. The radio frequency antenna may also be referred to as a channel or antenna. The radio-frequency coil 114 is connected to multiple radio frequency transceivers 118. It is understood that the radio-frequency coil 114 and the radio frequency transceivers 118 are representative. The radio-frequency coil 114 is intended to also represent a dedicated transmit antenna and a dedicated receive antenna. Likewise the transceiver 118 may also represent a separate transmitter and receiver.

Within the imaging zone 108, a region of interest 109 is indicated. The region of interest 109 is imaged using the radio-frequency coil 114. The radio-frequency coil 114 comprises a number of coil segments 116. The coil segments 116 may be connected either capacitively or via an electrical connection. The radio-frequency coil 114 is intended to be representative of different types of coils. The radio-frequency coil 114 could for example be a dipole antenna, a birdcage coil, or a TEM coil. The multiple transceivers 118 form a radio-frequency system 125. In the example there are multiple transceivers 118. In other examples a transceiver with multiple outputs (that operate separately) may be substituted as an alternative.

In this example, the coil segments 116 are shown as being connected by switching units 120. In this example, the magnetic resonance imaging system is shown as comprising multiple transceivers 118. The transceivers 118 each have an output which is connected to an RF matching detection system 122. The RF matching detection system 122 may for example take different forms in different examples. A simple example would be that the RF matching detection system 122 measures the reflected power for each of the transceivers 118. The RF matching detection system 122 may also in this case be built into the transceivers 118. The output of each of the transceivers 118 is connected to an RF port 124. In this case, the RF ports 124 are incorporated into the switch units 120. A possible modification of the radio-frequency coil 114 is to include a radio-frequency shield. Although not shown in FIG. 1, there may also be an RF port which connects between the coil segment 116 and the RF shield. The radio-frequency coil 114 may also comprise a substrate or carrier upon which the coil segments 116 are mounted. It is also possible that the switch unit 120 and/or the RF port 124 are also mounted on this carrier or structure support.

Within the bore 106 of the magnet 104 there is a subject support 128 which supports the subject 126 in the the imaging zone 108. A region of interest 109 can be seen within the imaging zone 108.

The transceivers 118 and the gradient power supply 112 are shown as being connected to a hardware interface 142 of a computer system 140. The computer system further comprises a processor 144 that is in communication with the hardware interface 142, memory 150, and a user interface 146. The memory 150 may be any combination of memory which is accessible to the processor 144. This may include such things as main memory, cached memory, and also non-volatile memory such as flash RAM, hard drives, or other storage devices. In some examples, the memory 150 may be considered to be a non-transitory computer-readable medium. The memory 150 is shown as storing machine-executable instructions 160 which enable the processor 144 to control the operation and function of the magnetic resonance imaging system 100. The memory 150 is further shown as containing imaging pulse sequence commands 162. Pulse sequence commands as used herein encompass commands or a timing diagram which may be converted into commands which are used to control the functions of the magnetic resonance imaging system 100 as a function of time. Pulse sequence commands are the implementation of the magnetic resonance imaging protocol applied to a particular magnetic resonance imaging system 100.

The computer memory 150 is further shown as containing imaging magnetic resonance data 164 that was acquired by the magnetic resonance imaging system using the imaging pulse sequence commands 162. The imaging pulse sequence commands 162 could for example specify a particular amount of radio-frequency power to be applied to the radio-frequency coil 114 using the transceivers 118. In order for this to be performed efficiently there needs to be impedance matching between the transceivers 118 and the radio-frequency coil 114. The processor 144 may use the machine-executable instructions 160 to acquire impedance matching data 166. The impedance matching data 166 could for example be data measured by the RF matching detection system 122. The computer memory 150 is further shown as containing switch unit control instructions 168 that may be used for controlling which of the RF ports 124 is enabled or connected to a transceiver 118. This may be used for controlling the impedance matching between the radio-frequency coil 114 and the transceivers 118. The computer memory 150 is further shown as containing a magnetic resonance image 170 that was reconstructed from the imaging magnetic resonance data 164.

FIG. 2 shows a flowchart which illustrates a method of operating the magnetic resonance imaging system 100 of FIG. 1. First in step 200 the impedance matching data 166 is measured using the RF matching detection system 122. Next in step 202 the switch unit control instructions 168 are determined using the impedance matching data 166. The switch unit control instructions 168 contain commands that control the at least one of the multiple RF ports 124 to couple or decouple to impedance match the radio-frequency system 125 to the radio-frequency coil 114. Finally in step 204 the switch units 120 are controlled using the switch unit control instructions 168.

FIG. 3 shows a further example of a method of controlling the magnetic resonance imaging system 100 of FIG. 1. First in step 300 the switching units 120 are set to a particular combination or permutation of being on and off. Next in step 302 for this particular on and off combination or permutation of the switching units 120, the impedance matching data is measured. Step 304 is a decision box asking whether all the permutations been measured. When the answer is no, then the method returns to step 300 and the switching units 120 are set to a different state and the impedance matching data is re-measured. When the answer is yes, then the method proceeds to step 202. The method steps 202 and 204 are equivalent with the method steps 202 and 204 shown in FIG. 2.

Some examples may relate to feeding RF power to a body coil for MRI. This coil may be a highly resonant antenna, designed for generating a well-defined magnetic field inside the human body. As a side effect, electric fields are causing losses which strongly change the input impedance of the coil. This mainly affects the real part of the impedance, the relative change is linked to the change of the resonance quality factor, also called the load factor. This is typically in the range of 3-5 for today's birdcage resonators, which are the preferred implementation for MRI body coils.

The RF power is fed into the body coil by pulsed amplifiers, which require good or at least acceptable power matching at their output. In quadrature operation, this is typically realized by using a hybrid coupler to drive two quadrature channels of the coil simultaneously. This coupler is a 4-port coupler, which has the coil feeding ports connected to its outputs, the amplifier at one input and a load (typically 50 Ohm, matching the transmission line impedance) connected to the remaining port. As long as the coil behaves symmetrically, which is typically given by the patient's symmetry, there is no power reflected to the amplifier. In case of non-ideal matching due to the variation in patient size, all the reflected power is concentrated in the load and therefore the amplifier stays well power matched all the time.

The situation explained above becomes different in case of multi-port feeding, for example, in 3 Tesla and greater MRI systems. Examples may use independent amplifiers to get rid of reflections to the amplifiers. In the past, expensive isolators (realized by circulators) were used to enforce power matching again. Another option is to oversize and optimize the amplifier such that it stays operational with higher reflected power (universal load approach).

The amplifier itself may consist of several modules which are combined to a single output. Due to losses of the power combiners, the RF amplifier has to be oversized more.

Examples may combine the power in a load-dependent way and inside the resonator itself instead of the amplifier. This may use a number of switchable feeding ports inside the coil. The number of ports used typically increases with the loading such that for a high patient load (corresponding to a big patient) we make use of all the available power modules. By changing the number of feeding ports, we also change the impedance matching in such a way, that each amplifier stays well matched for every load. By doing so, the system becomes more effective (w.r.t. power efficiency) and we do not need expensive circulators.

Figure 4:
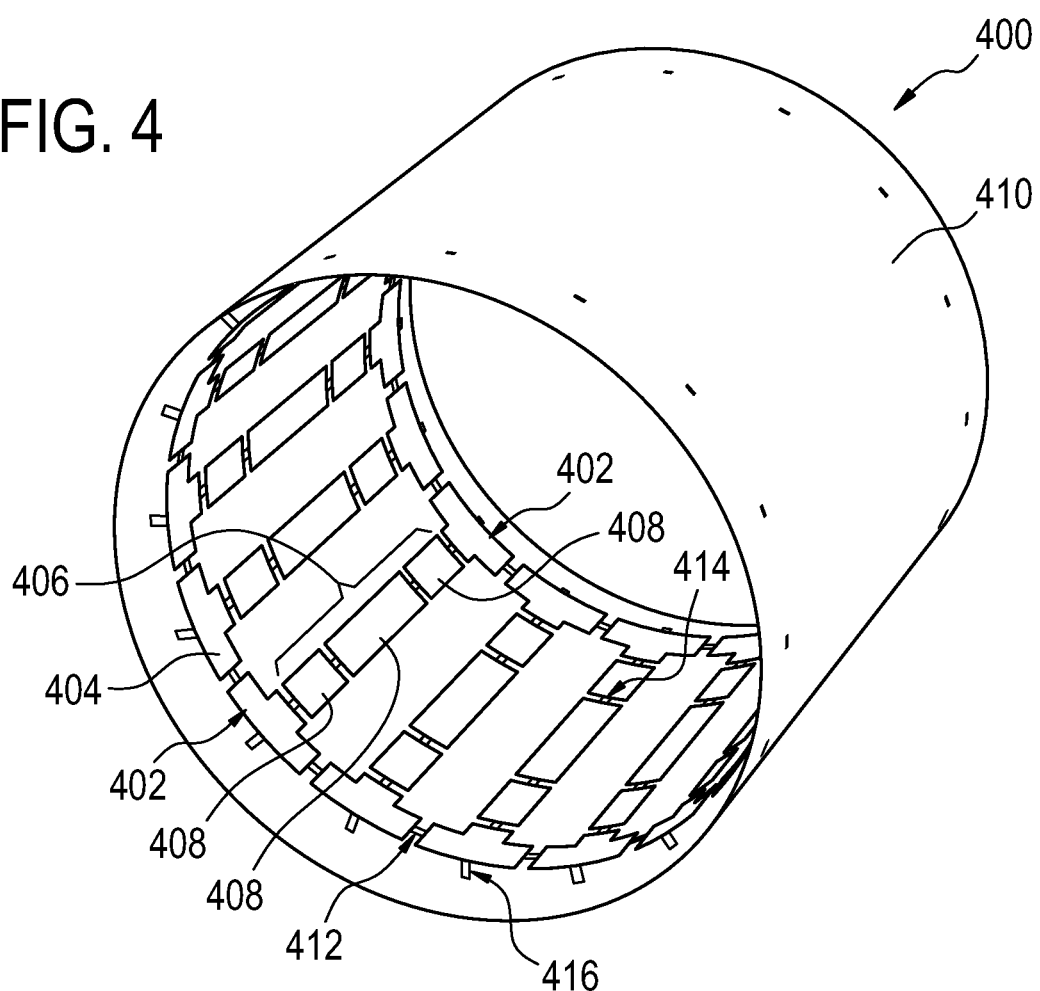
FIG. 4 shows a perspective illustration of a bird cage coil.
Figure 5:
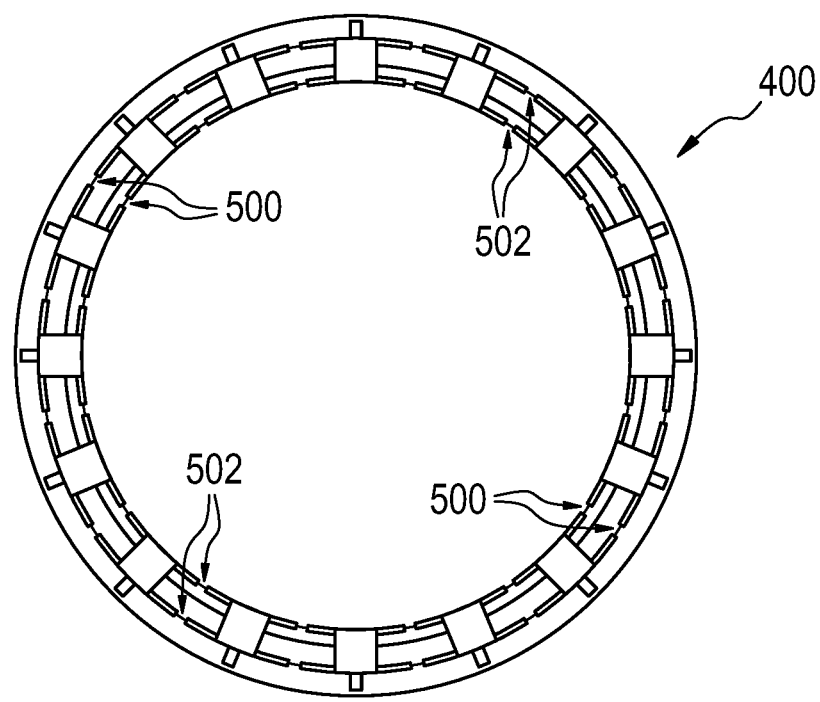
FIG. 5 shows a side view of the bird cage coil of FIG. 5.

FIGS. 4 and 5 illustrate an example of a birdcage coil 400. The birdcage coil comprises two end rings 402 which are connected by rungs 406. Each of the end rings 402 is divided into individual ring segments 404. The rungs 406 are divided into rung segments 408. The individual ring segments 404 may be connected together capacitively or via an electrical connection depending upon the design of the particular birdcage coil. Likewise the rung segments 408 may also be connected together capacitively or via an electrical connection. The end rings 402 may be connected to the rungs 406 also either capacitively or via an electrical connection.

The birdcage coil 400 is shown as containing an optional RF shield 410. There may also be capacitive connections between the radio-frequency shield 410 and the end rings 402. Connections between individual ring segments 404 may be used as a ring RF port 412. Connections between individual rung segments 408 may be turned into rung RF ports 414. The capacitive connection between the RF shield 410 and an end ring 402 may also be turned into a shield RF port 416. Switching units using components such as FET or pin diodes may be used to selectively add or remove a port. If the connection between two segments is an electrical connection or a short then the pin diode may be used to open or close this short to turn on or off the port. If the connection is capacitive a pin diode may be used in a similar fashion to add or remove a port. FIG. 5 shows a side view of the birdcage coil 400.

The circular structure of the birdcage coil 400 forces particular boundary conditions on a solution of electromagnetic waves in the birdcage coil 400. This enforces a particular phase arrangement between different ports on the birdcage coil 400. For example, FIG. 5 shows a group 1 of ring RF ports 500 and a group 2 of ring RF ports 502. The ring RF ports 500 are all at the same phase. That is to say that RF power can be added at these four ring RF ports using the same phase. The group 2 of ring RF ports 502 is rotated 90°. These ring RF ports 502 are 180° out of phase with the ring RF ports 500. These ring RF ports 500, 502 may be used to drive the birdcage coil 400 in quadrature.

In FIG. 4, the three different feeding positions are shown, which are typically used for feeding a birdcage body coil. For all these feeding positions, the power may be coupled in by galvanic connections as well as inductive feeding, which can be nicely realized by a resonant coupling loop. This has been successfully implemented in an eight channel transmit coil for a 3 Tesla MRI system as well as a special 1.5 Tesla type coil for a combined MRI and LINAC system.

For all the mentioned feeding positions, we also find at least four different ports, which carry almost the same current with respect to amplitude and phase inside the coil; at least by allowing 180° phase shift which can be compensated by flipping the port direction. A first embodiment might realize to stay with two orthogonal quadrature channels of the coil and use one up to four ports for feeding the coil with one, two, three, or four amplifiers per channel. The impedance seen by each amplifier differs now in case of changing the number of amplifiers. Note, that this impedance can just be defined by an active impedance, which is defined by the ratio of port voltage and current in case of feeding with all the amplifiers simultaneously, since this is the impedance which needs to be matched to. FIG. 5 shows two sets of ring capacitors, which correspond to the same mode.

FIG. 5 shows two sets of corresponding ring ports to drive a birdcage in quadrature. The resonant mode causes the current to be equal (or at least very similar) in all of the four corresponding ports. Therefore we can think of these feeding ports to be connected in series, which would have the same effect. The effective impedance of that resonance, i.e. the impedance $Z(n=1)$, would be measured in case of feeding at a single port is in principle fed by a number of n ports in series. At these ports, we have always the same current but just the total voltage divided by n. This yields the impedance seen at each port to be $Z(n=1)/n$.

Figure 6:
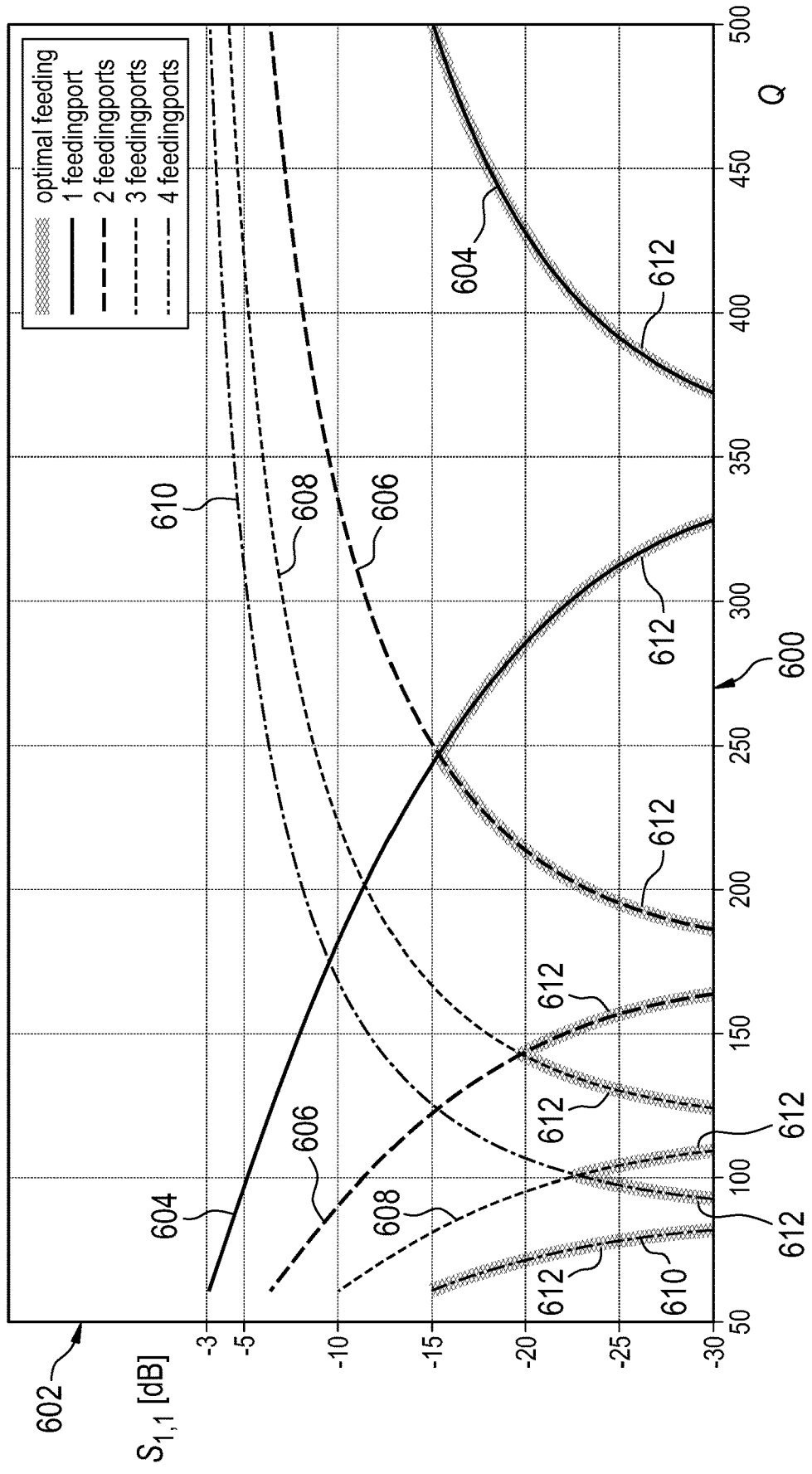
FIG. 6 is a plot which illustrates how dependence of the reflection coefficient vs the Q for a coil changes and the number of RF ports is changed.

FIG. 6 illustrates how the coil of FIGS. 4 and 5 can be matched by controlling the number of ports that are used. The x-axis 600 is the Q value of the coil when loaded and the y-axis 602 is the reflection coefficient. Curve 604 shows the relationship between Q and the reflection coefficient when only one feeding port is used. The curve 606 shows the relationship between Q and the reflection coefficient when two RF ports are used. The curve 608 shows the relationship between Q and the reflection coefficient when three RF ports are used. The curve 610 shows the relationship between Q and the reflection coefficient when four RF ports are used. Portions of these curves 604, 606, 608, 610 have been widened and are labeled 612. The portion 612 indicate an optional feeding arrangement for matching an RF system to the birdcage coil 400 of FIGS. 4 and 5. It can be seen from FIG. 6 that the reflection coefficient on the y-axis 602 can be kept below −15 db simply by controlling the number of RF ports which are used to feed the birdcage coil 400. The birdcage coil 400 in this situation can therefore be matched to a variety of Q values without the use of a convention impedance matching network.

A good matching of a coil or antenna may be indicated by a low reflection coefficient S1,1 of the coil, which depends on the deviation of the coil impedance Z to the transmission line impedance ZO. Typically, at least reflection coefficients of −10 to −15 dB can be reached in a realistic range of patients.

In FIG. 6, the reflection coefficient of a birdcage coil being excited by 1-4 rung ports or ring ports, as can be seen, a reflection of at least −15 dB can be reached for a load factor (LF, Q-ratio) range of more than 8 (=500/60) which is far beyond the typical patient variation. A single matching situation as it is used today just realizes this for LF-ratios up to 2. By using 2-4 feeding ports, a reflection of at least −20 dB may be realized for a LF range of 3 (214/72). A single matching only reaches this reflection for a LF range of 1.5.

FIG. 6 shows the reflection coefficient S1,1 in dependence of the quality factor Q, which is defined by the patient loading. A weak loading (e.g. from an infant) may lead to a high Q around 300 and a strong loading can lead to a Q around 100. The matching network can be used to scale the Q-axis. The different graphs show the load dependent reflection in case of feeding by 1, 2, 3, or 4 ports. Each single feeding covers a limited acceptable range of loading scenarios. The patient population defines a maximum and minimum load factor. Especially the low quality factors Q, corresponding to big patients, also demand a high transmit power and therefore suffer most from reflected power. By using the optimal number of feeding ports, a quotient of maximum and minimum Q of 3 is feasible with a reflection of less than 20 dB, which is more than sufficient. For weak loadings, being fed by a single port, the range can be enhanced to around 8.

An interesting side-effect is that using multiple feeding ports also improves the coil homogeneity, which is only demanded for strong loadings, corresponding to low quality factors. As we propose to use the maximum number of feeding ports only in case of strong loading, we still improve the homogeneity in cases where it is applicable.

Figure 7:
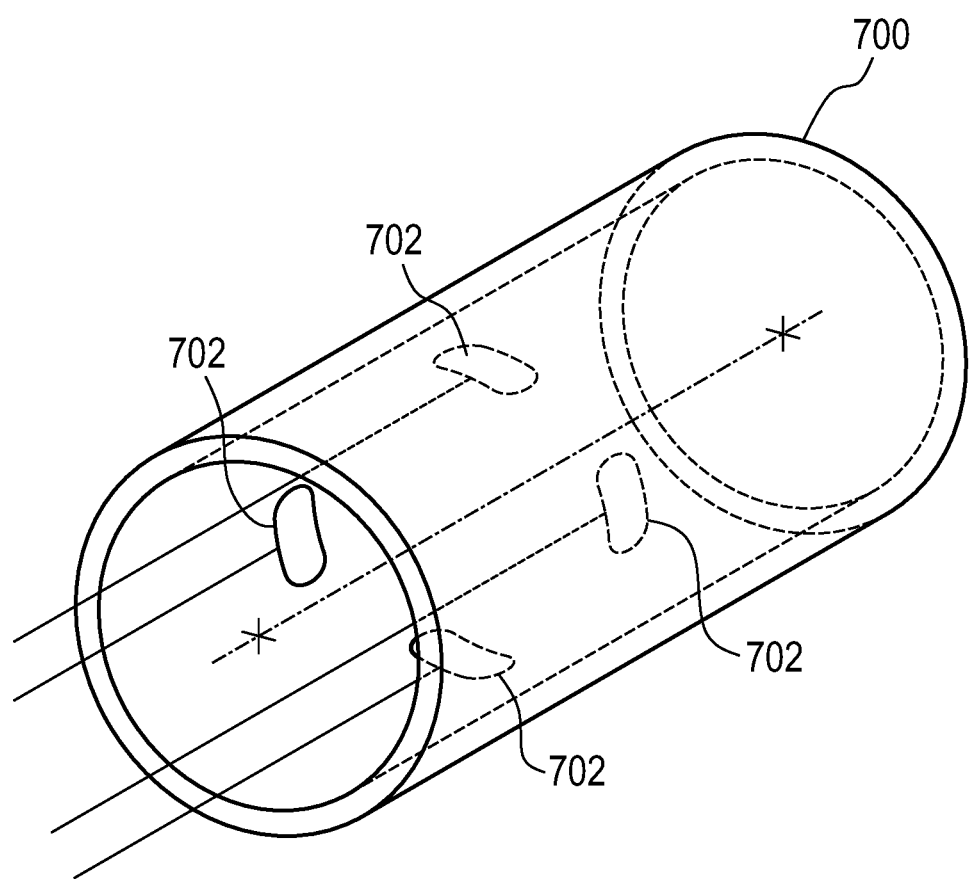
FIG. 7 shows a figure which illustrates inductive feeding loops for feeding a bird cage coil.
Figure 8:
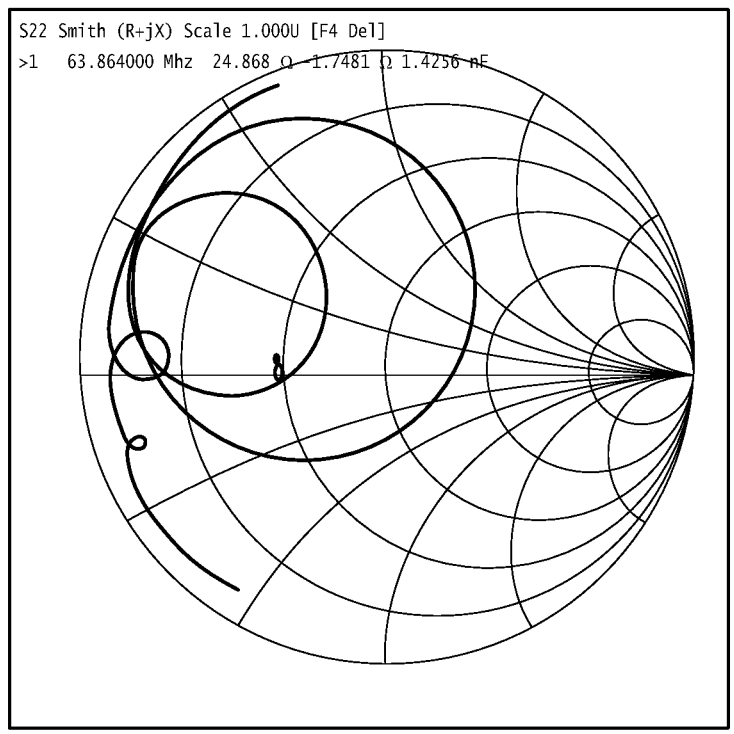
FIG. 8 shows a smith plot of the RF characteristics of the bird cage coil of FIG. 7 when a single RF port is used.
Figure 9:
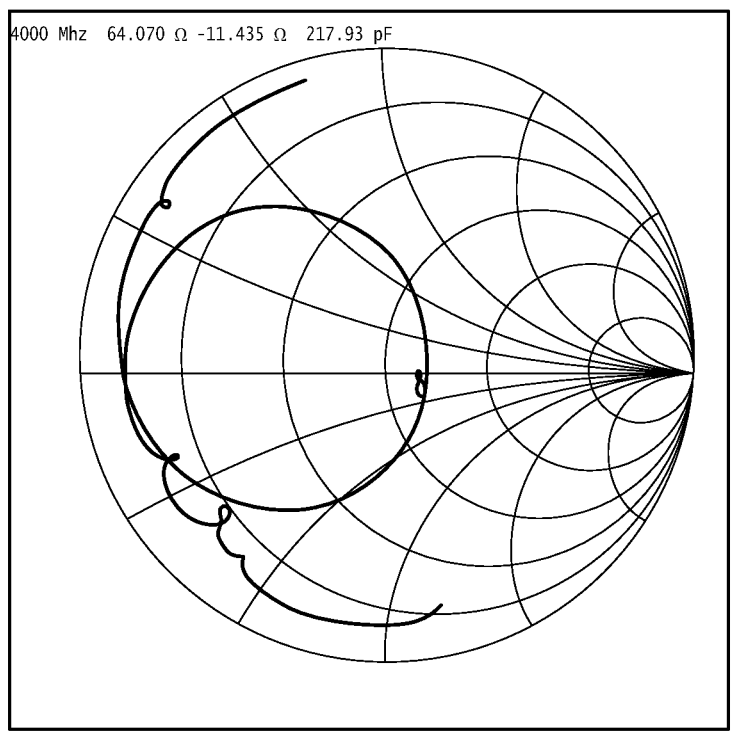
FIG. 9 shows a smith plot of the RF characteristics of the bird cage coil of FIG. 7 when two RF ports are used.

FIG. 7 shows an alternative method of constructing RF ports for the magnetic resonance imaging system. FIG. 7 shows a birdcage coil that has several inductive feeding loops 702 mounted within it. The inductive feeding loops 702 are tuned to couple to the birdcage coil. By putting them at 90° increments, four feeding ports that are each 90° out of phase with each other can be constructed. FIGS. 8 and 9 show Smith chart measurements for the impedance of the birdcage coil 700 shown in FIG. 7.

FIG. 8 shows the complex reflection coefficient in the Smith chart in case of using a single feeding loop 702. In this case it is matched to 25 ohm.

FIG. 9 shows the Smith chart which shows the reflection coefficient in the case of using both feeding ports. The impedance has doubled to around 50 ohm. The measurements shown in FIG. 8 or 9 are rough measurements and fine tuning the positioning or design of the conductive feeding loop could improve results.

Figure 10:
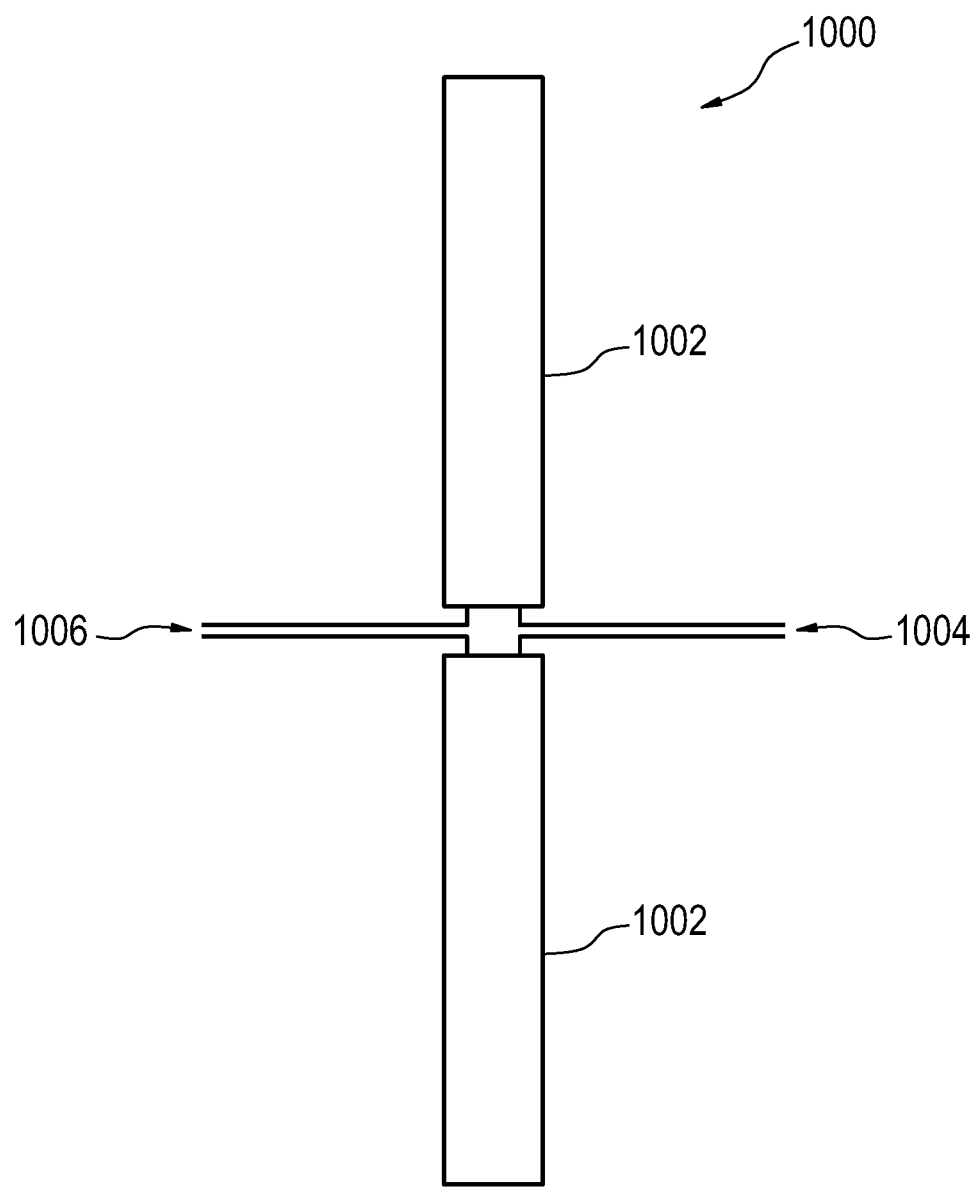
FIG. 10 illustrates an example of a dipole antenna.

FIG. 10 shows an example of a dipole antenna 1000. The dipole antenna 1000 comprises two dipole elements 1002. These for example could be conductive strips mounted on a carrier element. The dipole antenna 1000 may have any number of ports 1004, 1006 which are connected to both dipole elements 1002. Each of the ports 1004, 1006 would be connected to a separate radio-frequency power supply. By adjusting the number of ports 1004, 1006 the relationship between the current and voltage supplied to the dipole antenna 1000 can be controlled and thereby the matching. Although not shown in FIG. 10, there could also be switching units which are controlled by a solid state device such as a pin diode or FET transistor.

FIG. 11 shows an example of a TEM antenna 1100. The TEM antenna 1100 comprises a carrier structure 1102 with a number of strip elements 1104. The strip elements 1104 are antenna elements which are strongly coupled to each other at a particular frequency. The TEM antenna 1100 may be arranged as a flat or flexible surface or it may be rolled into a tube shape. When rolled into a tube shape, the TEM antenna 1100 resembles a birdcage coil without the end rungs.

In this example each of the strip elements 1104 is comprised of a number of strip segments 1106. The strip segments 1106 may be joined by a switching unit 120 or a connection 1108. The connection 1108 may for instance be either a short or it may be a capacitive connection. In this example each of the strip elements 1104 has one switching unit 120 that is connected to an RF port 124 and also a control line 1110. The control line 1110 may be used to switch the RF ports 124 in or out of the circuit to control the number of RF ports which feed the TEM antenna 1100.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 magnetic resonance system
104 main magnet
106 bore of magnet
108 imaging zone
109 region of interest
110 magnetic field gradient coils
112 gradient coil power supply
114 radio-frequency coil
116 coil segment
118 transceivers
120 switch unit
122 RF matching detection system
124 RF port
126 subject
128 subject support
140 computer system
142 hardware interface
144 processor
146 user interface
150 computer memory
160 machine executable instructions
162 imaging pulse sequence commands
164 imaging magnetic resonance data
166 impedance matching data
168 switch unit control instructions
170 magnetic resonance image 200 measure the impedance matching data using the RF matching detection system determine switch unit control instructions using the impedance matching data
20 control the switch unit of the at least one of the multiple RF ports with the switch unit control instructions
300 set single permutation of switching units
302 measure impedance matching data for single permutation
304 have all permutations been measured?
400 birdcage coil
402 end ring
404 ring segment
406 rung
408 rung segments
410 radio frequency shield
412 ring RF port
414 rung RF port
416 shield RF port
500 group one
502 group two
600 Q
602 Reflection coefficient
604 1 port used
606 2 ports used
608 3 ports used
610 4 ports used
612 optimal feeding
700 birdcage coil
702 inductive feeding loop
1000 dipole antenna
1002 dipole element
1004 first port
1006 second port
1100 TEM antenna
1102 carrier structure
1104 strip elements
1106 strip segment
1108 connection
1110 control line

The invention claimed is:

1. A magnetic resonance imaging system comprising:
a main magnet for generating a main magnetic field within an imaging zone;
a radio frequency (RF) coil for acquiring magnetic resonance data from the imaging zone, wherein the RF coil comprises a plurality of coil segments, a plurality of RF ports between adjacent coil segments of the plurality of coil segments, and a plurality of RF switches corresponding to the plurality of RF ports, wherein the plurality of RF switches are configured to individually couple or uncouple the plurality of RF ports to or from the RF coil;
a radio-frequency system for supplying RF power to the plurality of RF ports;
an RF matching detection system for measuring impedance matching data between the radio-frequency system and the RF coil;
a memory for storing machine executable instructions; and
a processor for controlling the magnetic resonance imaging system, wherein execution of the machine executable instructions causes the processor to:
measure the impedance matching data using the RF matching detection system;
determine switch control instructions using the impedance matching data, wherein the switch control instructions comprise commands for determining a number of RF ports of the plurality of RF ports to which the RF power is supplied, and for controlling the plurality of switches to couple the determined number of RF ports to the RF coil to receive the RF power, and to decouple remaining RF ports of the plurality of RF ports from the RF coil, in order to impedance match the radio-frequency system to the RF coil; and
control the plurality of switches with the switch control instructions.

2. The magnetic resonance imaging system of claim 1, wherein the measurement of the impedance matching data comprises repeatedly acquiring the impedance matching data while permutating states of the plurality of switches for the plurality of RF ports.

3. The magnetic resonance imaging system of claim 2, wherein the RF matching detection system comprises a reflected power sensor, wherein the impedance matching data comprises reflected power data for the plurality of RF ports.

4. The magnetic resonance imaging system of claim 2, wherein the RF matching detection system comprises a B1 magnetic field measurement system for measuring B1 magnetic field data descriptive of a B1 magnetic field generated by the RF coil, wherein the impedance matching data comprises the B1 magnetic field data.

5. The magnetic resonance imaging system of claim 4, wherein the B1 magnetic field measurement system comprises at least one magnetic field sensor.

6. The magnetic resonance imaging system of claim 4, wherein the B1 magnetic field measurement system comprises the RF coil and the radio-frequency system, wherein execution of the machine executable instructions causes the processor to acquire the B1 magnetic field data at least partially by:
controlling the magnetic resonance imaging system with B1 mapping pulse sequence commands to acquire B1 mapping magnetic resonance data, wherein the B1 mapping pulse sequence commands cause the magnetic resonance imaging system to acquire the B1 mapping magnetic resonance data according to a B1 mapping magnetic resonance imaging protocol; and
reconstructing a B1 field map from the B1 mapping magnetic resonance data according to the B1 mapping magnetic resonance imaging protocol, wherein the impedance matching data comprises the B1 field map.

7. The magnetic resonance imaging system of claim 1, wherein the RF coil comprises a birdcage coil, wherein the plurality of RF ports comprise a plurality of inductive feeding loops, and wherein each inductive feeding loop of the plurality of inductive feeding loops is configured for coupling inductively to the birdcage coil.

8. The magnetic resonance imaging system of claim 7, wherein the switch of each feeding loop of the plurality of inductive feeding loops is configured for creating an open circuit in the inductive feeding loop or for deactivating the inductive feeding loop.

9. The magnetic resonance imaging system of claim 7, wherein the RF matching detection system comprises the radio-frequency system and at least two inductive feeding loops of the plurality of inductive feeding loops, wherein the impedance matching data comprises load factor data, wherein the load factor data is descriptive of a load factor or a Q value of the RF coil, wherein measurement of the impedance matching data using the RF matching detection system comprises:

providing a known RF signal to one of the at least two inductive feeding loops using the radio frequency-system;

measuring a measured RF signal from another one of the at least two inductive feeding loops using the radio frequency-system; and calculating the load factor or the Q value using the measured RF signal.

10. The magnetic resonance imaging system of claim 1, wherein the RF coil is birdcage coil.

11. The magnetic resonance imaging system of claim 10, wherein the birdcage coil comprises two end rings, wherein the birdcage coil comprises a plurality of rungs connecting the two end rings, and wherein:

each of the two end rings comprises ring segments, wherein at least one RF port of the plurality of RF ports is connected across two of the ring segments;

each of the plurality of rungs comprises rung segments, wherein at least one RF port of the plurality of RF ports is connected across two of the rung segments; and/or the birdcage coil comprises an RF shield, wherein at least one RF port of the plurality of RF ports is connected across the RF shield and one of the two end rings.

12. The magnetic resonance imaging system of claim 1, wherein the RF coil is a TEM coil comprising strip elements, wherein the strip elements comprise strip segments, and wherein at least one RF port of the plurality of RF ports is connected across two of the strip segments.

13. The magnetic resonance imaging system of claim 1, wherein execution of the machine executable instructions further causes the processor to:

control the magnetic resonance imaging system to acquire imaging magnetic resonance data using imaging pulse sequence commands, wherein the imaging pulse sequence commands are configured to control the magnetic resonance imaging system to acquire the imaging magnetic resonance data according to a magnetic resonance imaging protocol; and reconstruct a magnetic resonance image using the imaging magnetic resonance data.

14. A method of operating a magnetic resonance imaging system wherein the magnetic resonance imaging system comprises:

a main magnet for generating a main magnetic field within an imaging zone;

a radio frequency (RF) coil for acquiring magnetic resonance data from the imaging zone, wherein the RF coil comprises plurality of coil segments, a plurality of RF ports between adjacent coil segments of the plurality of coil segments, and a plurality of RF switches corresponding to the plurality of RF ports and configured to individually couple or uncouple the plurality of RF ports from the RF coil;

a radio-frequency system for supplying RF power to the plurality of RF ports;

an RF matching detection system for measuring impedance matching data between the radio-frequency system and the RF coil;

wherein the method comprises:

measuring the impedance matching data using the RF matching detection system;

determining a number of RF ports of the plurality of RF ports to which RF power is supplied; and controlling the plurality of switches to couple the determined number of RF ports to the RF coil to receive the RF power, and to decouple remaining RF ports of the plurality of RF ports from the RF coil, in order to impedance match the radio-frequency system to the RF coil.

15. A non-transitory computer readable medium that stores machine executable instructions for execution by a processor controlling a magnetic resonance imaging system, wherein the magnetic resonance imaging system comprises:

a main magnet for generating a main magnetic field within an imaging zone;

a radio frequency (RF) coil for acquiring magnetic resonance data from the imaging zone, wherein the RF coil comprises a plurality of coil segments, a plurality of RF ports between adjacent coil segments of the plurality of coil segments, and a plurality of RF switches corresponding to the plurality of RF ports and configured to individually couple or uncouple the plurality of RF ports from the RF coil;

a radio-frequency system for supplying RF power to the plurality of RF ports;

an RF matching detection system for measuring impedance matching data between the radio-frequency system and the RF coil;

wherein execution of the machine executable instructions causes the processor to:

measure the impedance matching data using the RF matching detection system;

determine a number of RF ports of the plurality of RF ports to which RF power is supplied; and control the plurality of switches to couple the determined number of RF ports to the RF coil to receive the RF power, and to decouple remaining RF ports of the plurality of RF ports from the RF coil, in order to impedance match the radio-frequency system to the RF coil.

16. The magnetic resonance imaging system of claim 1, wherein the RF coil is a single dipole antenna.

17. The magnetic resonance imaging system of claim 1, wherein execution of the machine executable instructions further causes the processor to control the radio-frequency system to switch off RF power sources that otherwise supply RF power to the decoupled remaining RF ports.

18. The magnetic resonance imaging system of claim 1, wherein the radio-frequency system comprises one or more transceivers.

19. The magnetic resonance imaging system of claim 1, wherein the radio-frequency system comprises one or more transmitters and/or receivers.

20. The magnetic resonance imaging system of claim 1, wherein the plurality of switches comprise pin diodes and/or FET transistors.

* * * * *